(12) United States Patent
Masunaga et al.

(10) Patent No.: US 8,273,830 B2
(45) Date of Patent: Sep. 25, 2012

(54) DEPROTECTION METHOD OF PROTECTED POLYMER

(75) Inventors: Keiichi Masunaga, Joetsu (JP); Takeru Watanabe, Joetsu (JP); Daisuke Domon, Joetsu (JP); Satoshi Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 103 days.

(21) Appl. No.: 12/901,903

(22) Filed: Oct. 11, 2010

(65) Prior Publication Data

US 2011/0086986 A1    Apr. 14, 2011

(30) Foreign Application Priority Data

Oct. 13, 2009 (JP) .................................. 2009-236353

(51) Int. Cl.
C08F 8/12          (2006.01)
C08F 120/16    (2006.01)

(52) U.S. Cl. ...................... 525/329.5; 525/375; 525/380; 525/382; 526/313

(58) Field of Classification Search ................ 525/329.5, 525/375, 380, 382; 526/313
See application file for complete search history.

(56) References Cited

U.S. PATENT DOCUMENTS

| | | | |
|---|---|---|---|
| 4,822,862 A | 4/1989 | Rupp et al. | |
| 4,868,256 A | 9/1989 | Aslam et al. | |
| 4,912,173 A | 3/1990 | Keene et al. | |
| 5,264,528 A | 11/1993 | Sheehan et al. | |
| 5,625,020 A * | 4/1997 | Breyta et al. ............... | 526/329.2 |
| 6,641,975 B2 | 11/2003 | Takeda et al. | |
| 7,501,223 B2 * | 3/2009 | Takeda et al. .............. | 430/270.1 |
| 2003/0118934 A1 | 6/2003 | Takeda et al. | |
| 2008/0020289 A1 | 1/2008 | Hatakeyama et al. | |
| 2008/0241751 A1 | 10/2008 | Takeda et al. | |
| 2009/0030177 A1 | 1/2009 | Takeda et al. | |
| 2011/0177464 A1 | 7/2011 | Takeda et al. | |

FOREIGN PATENT DOCUMENTS

| | | |
|---|---|---|
| CN | 101387831 | 3/2009 |
| EP | 0314488 A2 | 5/1989 |
| JP | 01139546 A | 6/1989 |
| JP | 01-188502 A | 7/1989 |
| JP | 2002-062652 A | 2/2002 |
| JP | 2002-244297 A | 8/2002 |
| JP | 2003-084440 A | 3/2003 |
| JP | 2007-254495 A | 10/2007 |
| JP | 2009024122 A | 2/2009 |

OTHER PUBLICATIONS

Leo, Albert J., "Methods of Calculating Partition Coefficients", Comprehensive Medicinal Chemistry, vol. 4, Pergamon Press, 1990, pp. 295-319.
Hu, Qinghui, "The First Office Action" prepared for Application No. 201010505496.X, May 31, 2012, 8 pages.

* cited by examiner

Primary Examiner — Fred M Teskin
(74) Attorney, Agent, or Firm — Winstead PC

(57) ABSTRACT

Provided is a method of deprotecting a protected polymer, the method being capable of, in the deprotection reaction of a polymer comprising a unit structure having a phenolic hydroxyl group protected with an acyl group, deacylating the polymer in a short period of time while maintaining the other structure, and being capable of taking out the deacylated polymer while highly suppressing contamination of the deacylated polymer with a substance other than the polymer taking part in the reaction. More specifically, provided is a method of deprotecting a protected polymer comprising at least a step of dissolving in an organic solvent the protected polymer comprising at least a unit structure having a phenolic hydroxyl group protected with an acyl group and a deprotecting reagent selected from primary or secondary amine compounds each having a ClogP value of 1.00 or less with the proviso that in the secondary amine compound, neither of the two carbon atoms coupled to the nitrogen atom of the amino group is tertiary. The primary or secondary amine compounds are each represented preferably by $HNR^1_{2-n}R^2_n$ (1).

7 Claims, No Drawings

DEPROTECTION METHOD OF PROTECTED POLYMER

BACKGROUND OF THE INVENTION

1. Field of the Invention

The present invention relates to a deprotection method for removing a protecting group from a polymer obtained by polymerization while protecting a functional group, or a polymer obtained by modification of a side chain. In particular, the invention relates to a method of producing a polymer to be used as a chemically amplified photoresist material.

2. Description of the Related Art

Along with an increase in the integration density of integrated circuits, formation of more minute patterns has been required in recent years. In processing into patterns having a size of 0.2 µm or less, chemically amplified resist using an acid as a catalyst has mainly been used. As an exposure light source upon this processing, high energy radiation such as KrF excimer laser light, ArF excimer laser light, EUV, or electron beams has been used. In particular, the electron beam lithography used as a microfabrication technology has been inevitable as a processing method of a photomask blank to be used for the formation of a photomask for manufacturing a semiconductor.

In general, a resin comprised by a resist composition and designed for a KrF excimer laser light or electron beam as high energy radiation for pattern exposure comprises a unit structure having a phenolic hydroxyl group as a functional group giving good substrate adhesion, while development of resist for EUV exposure has also been promoted in this direction. As a typical example of the unit structure having a phenolic hydroxyl group, 4-hydroxystyrene is well-known. A hydroxystyrene monomer does not have high stability so that a polymer having a hydroxystyrene unit is often obtained by polymerizing or copolymerizing an acetoxystyrene monomer having good stability and polymerizability and then deacetylating the resulting polyacetoxystyrene derivative by using methanolysis with triethylamine/methanol or by using a base such as ammonia water, sodium hydroxide, sodium methoxide or hydroxylamine hydrochloride.

JP 01-188502A/1989 discloses a method of carrying out a deprotection reaction of a polymer having an acetoxystyrene unit structure and being a typical resist material, in the suspension as an aqueous reaction mixture. JP 01-188502A/1989 discloses many usable bases. These bases may be usable even in a homogeneous deprotection reaction conducted by dissolving both a polymer protected with an acyl group, which is a reaction substrate, and a deprotecting reagent in an organic solvent.

Although the polymer having a hydroxystyrene unit structure to be used as a base polymer for the resist includes a homopolymer of hydroxystyrene, a functional structure may be introduced into the polymer in the form of an ester bond as a controlling factor of the physical properties or functions of the resulting resist. In order to synthesize such a polymer, it is the common practice to obtain a targeted polymer by copolymerizing (meth)acrylic acid ester derived from an aliphatic alcohol having the above-described functional structure (for example, JP 2002-62652) or vinyl aromatic carboxylic acid ester (for example, JP 2007-254495) with acetoxystyrene or a vinyl aromatic compound having a phenolic hydroxyl group protected with an acetyl group and then deprotecting the resulting polymer. The term "(meth)acrylic acid" means methacrylic acid and/or acrylic acid.

In deprotection of such a polymer comprising an ester derived from an aliphatic alcohol as described above, selective cleavage of a phenol ester is required while maintaining the ester derived from an aliphatic alcohol. Accordingly, hydrolysis with a weak base has conventionally been conducted. As a stable industrial production process, it is difficult to adopt a reaction in use of ammonia water as a weak base, because volatility of ammonia prevents the reaction temperature from being higher. A methanolysis deprotection reaction in methanol in use of triethylamine as a base is therefore ordinarily used. The triethylamine is an organic base.

SUMMARY OF THE INVENTION

Since the methanolysis using triethylamine is a reaction having a low reactivity, a reaction with high selectivity as described above can be realized. When an ester derived from a phenolic hydroxyl group and an ester derived from an aliphatic alcohol are present together, the ester derived from a phenolic hydroxyl group can be decomposed selectively. This method, however, requires a considerably long reaction time so that it is not suitable for improving productivity.

An object of the present invention is to provide a method of deprotecting a protected polymer, the method being capable of, in the deprotection reaction of a polymer comprising a unit structure having a phenolic hydroxyl group protected with an acyl group as described above, deacylating the polymer in a shorter period of time while maintaining the other structure and being capable of taking out the deacylated polymer while highly suppressing the contamination of the deacylated polymer with a substance other than the polymer taking part in the reaction.

With the foregoing in view, the present inventors have carried out various investigations. As a result, it has been found that when a primary or secondary amine compound is used as a base in a deprotection reaction of a polymer comprising a unit structure having a phenolic hydroxyl group protected with an acyl group, the reaction proceeds very rapidly compared with a reaction using triethylamine in agreement with as information of the general organic chemistry, but there is a higher risk that an amide, which is produced simultaneously as a byproduct of the reaction, is present as an impurity in the purified polymer obtained as a final product. It has been also found, however, that contamination with the byproduct amide can be suppressed when a deprotection reaction of a polymer comprising a unit structure having a phenolic hydroxyl group protected with an acyl group is performed by using a primary or secondary amine having high water solubility, leading to the completion of the present invention.

The present invention can provide a method of deprotecting a protected polymer comprising at least a step of dissolving in an organic solvent a protected polymer comprising at least a unit structure having a phenolic hydroxyl group protected with an acyl group and a deprotecting reagent selected from primary or secondary amine compounds each having a ClogP value of 1.00 or less with the proviso that in the secondary amine compound, neither of two carbon atoms coupled to the nitrogen atom of the amino group is tertiary, to deprotect the protected polymer. According to this method of deprotecting, the reaction time can be reduced greatly compared with the method using triethylamine, because of use of the primary or secondary amine compound. In addition, since the ClogP value is 1.00 or less, an amide having high water solubility is produced as a byproduct of the deprotection reaction, facilitating removal of the amide in the purification step for obtaining a purified polymer.

The primary or secondary amine compound is preferably represented by the following formula (1):

$$HNR^1{}_{2-n}R^2{}_n \qquad (1)$$

In the formula (1), $R^1$ represents a hydrogen atom or a linear, branched or cyclic $C_{1-6}$ alkyl group, $R^2$ independently represents a linear, branched or cyclic $C_{2-7}$ alkyl group comprising at least one oxygen atom or at least one nitrogen atom, two $R^2$s may be coupled to each other to form a cyclic structure containing at least one oxygen atom and/or at least one nitrogen atom, and n stands for 1 or 2.

By using the deprotection method of a polymer comprising a unit structure having a phenolic hydroxyl group protected with an acyl group according to the present invention, deprotection can be completed in a short period of time and a highly pure deprotected polymer can be obtained easily from a reaction mixture for deprotection.

DETAILED DESCRIPTION OF THE PREFERRED EMBODIMENTS

Polymers for resist film to be used in the photolithography process in which pattern exposure to high energy radiation is performed to change the solubility of an exposed portion of the polymer in a developer, followed by development to obtain a desired pattern, are required to have various functions. The function of changing the solubility in the developer as described above is one of the most important functions of the polymer, but adhesion of the polymer to a substrate to be processed is also one of the most important functions.

The design of the polymer sometimes differs utterly, depending on the kind of the high energy radiations used for exposure. A polymer having an aromatic skeleton is useful as a polymer for exposure to a KrF excimer laser light, electron beam or EUV. When the polymer having an aromatic skeleton is used, a phenolic hydroxyl group is usually employed as a functional group for imparting the polymer with the above-described adhesion function. A base polymer is therefore designed to have a predetermined amount of repeating unit having a phenolic hydroxyl group. It is because a partial structure comprising an aromatic ring having a phenolic hydroxyl group has good etching resistance and preferable polarization. These characteristics of this structure have been utilized without limiting to a chemically amplified resist since very early days when the aqueous developable positive resist was used.

4-Hydroxystyrene is used frequently as the repeating unit having a phenolic hydroxyl group. Since a hydroxystyrene has low stability as a monomer, a polymer having a phenolic hydroxyl group is usually obtained by carrying out polymerization by protecting a phenolic hydroxyl group with a protecting group and then deprotecting the polymer. In polymerizable compounds such as indene and acenaphthylene, derivatives having a phenolic hydroxyl group (JP 2003-84440A, JP 2002-244297A and so on) have a relatively high stability. Even when such a material is used, demetallization treatment after polymerization reduces the treatment efficiency when the material has a free phenolic hydroxyl group. Accordingly, employed may be a method for producing a base polymer, comprising the steps of providing a protected polymer at first, subjecting the protected polymer to the demetallization treatment, and then deprotecting the treated polymer to obtain a base polymer.

Specific examples of the compound having a phenolic hydroxyl group include hydroxystyrene such as 4-hydroxystyrene, 4-hydroxy-3-methylstyrene and 3-hydroxystyrene; hydroxyvinylnaphthalene; hydroxyvinylanthracene; hydroxyindene; and hydroxyacenaphthylene.

Many methods of protecting a phenolic hydroxyl group are known as general methods of organic chemistry. Protection with an acyl group, which can be removed under a basic condition, is a useful method for the synthesis of a polymer further comprising a repeating unit having an acid-labile group (acid decomposable protecting group) which controls the function of changing the solubility of the resist polymer in a developer. Accordingly, the protection with an acyl group has been used frequently.

The protection with an acyl group may be employed for a monomer for polymerization (not described in detail herein because of a fundamental method in organic synthesis) or a synthetic intermediate of a monomer (for example, JP 01-139546A/1989). An acyl-protected monomer or a mixture containing an acyl-protected monomer may be then polymerized to produce an acyl-protected polymer. Protection with an acyl group may be performed after formation of a polymer for the purpose of facilitating removal of a metal or for the other purpose.

The acyl group is usually represented by R—CO—. A monomer is usually purified by distillation prior to polymerization. As a protecting group, an acyl group having 7 or less carbon atoms is usually selected because of easy distillation. Industrially, an acetyl group is often employed as a protecting group. Most of the following description will be based on the examples where an acetyl group, which is the most widely used protecting group, is used for protection. However, it is evident that the deprotection method of the present invention is also applicable to the other acyl group.

Radical polymerization is ordinarily employed for the polymerization of an acyl-protected monomer or a mixture containing an acyl-protected monomer. Cationic polymerization may be employed in some cases. A number of methods are known for synthesizing a polymer for a base resin of a resist composition by radical polymerization (for example, the above-described JP 01-188502A/1999, JP 2002-062652A, JP 2007-254495A, JP 2003-084440A, JP 2002-244297A and JP 01-139546A/1989). The polymer to which the deprotection method of the present invention is applied can also be obtained according to the known methods. Copolymerization of a (meth)acrylic acid ester as well as a compound having, as a polymerization active site, a double bond conjugated to an aromatic compound such as acetoxystyrene, indene or acenaphthylene (for example, JP 2002-062652A, JP 2007-254495A, JP 2003-084440A and JP 2002-244297A) is also often conducted.

In the deprotection reaction of a polymer comprising a repeating unit having a phenolic hydroxyl group protected with an acyl group as described above, the polymer being to be used as a resist material, a weak base has been selected and in many cases, tertiary amine such as triethylamine has been used according to the requests such as no contamination due to a metal such as sodium, stable reaction results with high reproducibility and no deteriorating effect on the other partial structures. A solvolysis reaction using triethylamine together with water or alcohol has been used for various polymers because the reaction is mild and does not deteriorate the other partial structures. However, the solvolysis reaction is very slow and economically disadvantageous.

The present inventors therefore have attempted deprotection with a primary amine as a deprotection reaction having a high reaction rate. As well-known in the general organic chemistry, the deprotection reaction with a primary amine has a high reaction rate because a nucleophilic reaction of an amine compound to an acyl group occurs preferentially to a solvolysis reaction. When an ester structure derived from an aliphatic alcohol is present in the polymer, there is a possibility that no selectivity between the alcohol-derived ester structure and the phenol-derived ester structure is obtained. However, the result of the actual attempt has revealed that selectivity between two ester structures derived from different hydroxyl groups can be ensured, depending on the reaction condition selected. However, it has been found based on isolation of the polymer that, for example, deprotection of poly(acetoxystyrene-t-butoxystyrene) by using n-butylamine results in that a trace of n-butylacetamide produced as a byproduct of the deprotection reaction is present in the deprotected polymer obtained after purification. The amide compound produced as a byproduct of a nucleophilic reaction of the amine compound is almost neutral so that it becomes an impurity having difficulty in being removed in comparison with triethylamine which can be removed by using an aqueous solution of a weak acid. On the other hand, the amide compound is basic enough to trap a strong acid so that when it remains, it has a high risk of affecting a resist sensitivity or pattern shape. In addition, the amide compound that has remained without being removed may be a cause of development defects.

The present inventors have found that when an amine compound having high water solubility is selected as the primary or secondary amine compound, the amide compound can be removed into the aqueous solution by using an ordinary purification method based on re-precipitation or two-phase separation.

The present invention relates to a method of deprotecting a polymer comprising a repeating unit in which a phenolic hydroxyl group is protected with an acyl group as described above by using with the below-described amine compound. The amine compound used here is a primary or secondary amine compound having high reactivity with the acyl group as described above and having a ClogP value, which is a factor showing water solubility derived from a chemical structure, of 1.00 or less in order to ensure water solubility of an amide which is a byproduct of the reaction with the acyl group.

The terms "logP" and "ClogP" will be described.

The term "logP" is a logarithm of an 1-octanol/water partition coefficient of a compound and means, in the partition equilibrium when the compound is dissolved as a solute into two liquid phase solvents of 1-octanol and water, a ratio of the equilibrium concentrations of the solute in the respective solvents. It is usually expressed in the form of "logP", that is, logarithm to the base 10. This means that logP is an index of hypophilicity (hydrophobicity) and the greater this value, the more hydrophobic, while the smaller this value, the more hydrophilic.

"ClogP" is a "calculated logP (ClogP)" determined by the fragment approach of Hansch and Leo in the program "CLOGP" (Daylight CIS). The fragment approach is based on the chemical structure of a compound and consideration of the number of atoms and the type of chemical bond (A. Leo, Comprehensive Medicinal Chemistry, Vol. 4, C. Hansch, P. G. Sammens, J. B. Taylor and C. A. Ramsden, Eds., p. 295, Pergamon Press, 1990). The "ClogP" is the most reliable and widely used estimate of a logP value. In the present invention, either of the measured logP value or ClogP determined by calculation according to the program CLOGP is usable, but ClogP value is used preferably as a standard.

Some amine compounds having an oxygen functional group and, for reference, ClogP values when n-butanol is used as a solvent are shown below.

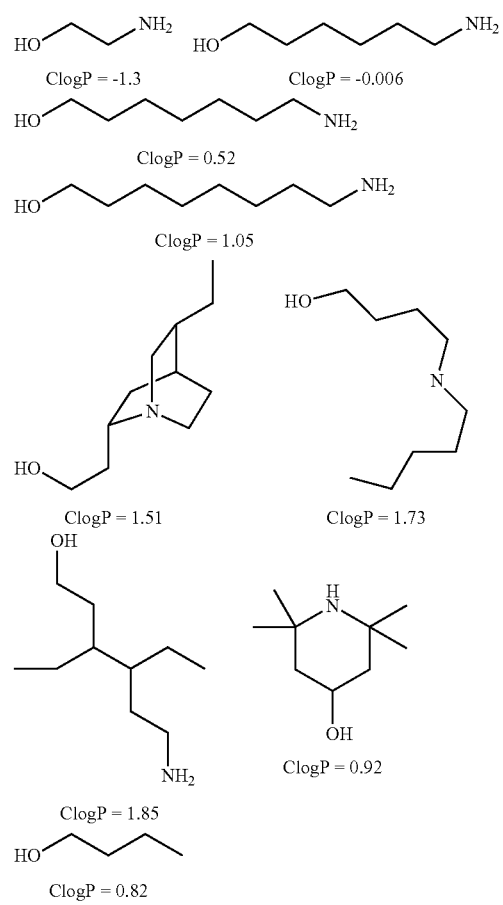

8-Hydroxyoctylamine has a ClogP value of 1.05 and has low water solubility so that it is not suited for the object of the present invention.

The secondary amine compound having two tertiary carbons as two carbon atoms coupled to the nitrogen atom of the amino group are omitted. For example, 2,2,6,6-tetramethyl-4-hydroxypiperidine has a ClogP value of 0.92 and shows desirable water solubility. However, two carbon atoms of the compound coupled to the nitrogen atom, which is a basic center, are tertiary so that the compound has low nucleophilicity and is not suited for the object of the present invention.

Compounds having a ClogP value of 0 or less have particularly high water solubility so that a byproduct amide can be removed particularly easily from the purified polymer.

In order to adjust the ClogP value to 1 or less, it is usually a standard to design the amine compound so that in the formula (1), a total amount [C] of carbon atoms comprised by $R^1$ and $R^2$ and a total amount [ON] of an oxygen atom and a nitrogen atom comprised by $R^2$ satisfy the following inequality: $[C]<\{([ON]+1)\times 4\}$. In order to enhance the water solubility further and thereby effectively achieve the advantage of the invention, it is preferred to design the amine compound so that they satisfy the following inequality: $[C]\leq\{([ON]+1)\times 3\}$.

The primary or secondary amine compound used as a deprotecting reagent is preferably represented by the following formula (1):

In the formula (1), $R^1$ represents a hydrogen atom or a linear, branched or cyclic $C_{1-6}$ alkyl group, $R^2$ independently represents a linear, branched or cyclic $C_{2-7}$ alkyl group comprising at least one oxygen atom or at least one nitrogen atom, two $R^2$(s) may be coupled to each other to form a cyclic structure containing at least one oxygen atom and/or at least one nitrogen atom, and n stands for 1 or 2. It is described that $R^2$ represents the alkyl group. With regard to $R^2$, an atom directly coupled to a nitrogen atom represented by N in the formula (1) is a carbon atom.

As defined in the formula (1), the nitrogen atom as a basic center comprises one or more alkyl groups (with the proviso that an atom directly bound to the nitrogen atom as a basic center is a carbon atom) comprising at least one oxygen atom or at least one nitrogen atom, and the alkyl group comprising at least one oxygen atom or at least one nitrogen atom is selected from linear, branched or cyclic $C_{2-7}$ alkyl groups. Further, two alkyl groups comprising at least one oxygen atom or at least one nitrogen atom may be coupled to each other to form a cyclic structure comprising the nitrogen atom as a basic center, or to form a cyclic structure comprising at least one oxygen atom or at least one nitrogen atom, separately from the nitrogen atom as a basic center.

The base represented by the formula (1) may comprise a linear, branched or cyclic $C_{1-6}$ alkyl group as $R^1$.

Examples of the linear, branched or cyclic $C_{1-6}$ alkyl group may include methyl, ethyl, propyl, isopropyl, butyl, pentyl, hexyl, and branched alkyl groups and cyclohexyl groups which are structural isomers thereof.

As described above, $R^2$ is selected from linear, branched or cyclic $C_{2-7}$ alkyl groups comprising at least one oxygen atom or at least one nitrogen atom. Further, two alkyl groups comprising at least one oxygen atom or at least one nitrogen atom may be coupled to each other to form a cyclic structure comprising a nitrogen atom as the basic center. Moreover, it may form a cyclic structure comprising at least one oxygen atom or at least one nitrogen atom, separately from the nitrogen atom as the basic center.

When $R^2$ comprises at least one oxygen atom, alkoxy-substituted alkyl group is preferably selected. Preferred examples may include 2-methoxyethyl, 2-ethoxyethyl, 2-propoxyethyl, 2-isopropoxyethyl, 2-methoxypropyl, 2-ethoxypropyl, 2-propoxypropyl, 2-isopropoxypropyl, 3-methoxypropyl, 3-ethoxypropyl, 3-propoxypropyl and 3-isopropoxypropyl. The alkoxy group may preferably have one to three carbon atoms. When the alkyl group is not substituted with an alkoxy group or has carbon atoms greater than 7, the resulting basic compound may have water solubility reduced and become difficult to be removed from the polymer solution after reaction. When the alkyl group is substituted with an alkoxy group, the compound in which the alkoxy group is placed on the carbon atom at the β- or γ-position relative to the nitrogen atom as the basic center can be easily prepared.

When $R^2$ comprises at least one oxygen atom, a hydroxyl-substituted alkyl group can be selected preferably. Preferred examples may include 2-hydroxyethyl, 2-hydroxypropyl, 2-hydroxybutyl, 3-hydroxypropyl, 2-(2'-hydroxyethoxy)ethyl, 2-(2'-hydroxyethoxy)propyl, 3-(2'-hydroxyethoxy)propyl, 1-methyl-2-hydroxypropyl and 2,3-dihydroxypropyl.

When $R^2$ comprise at least one nitrogen atom, an alkyl group having an amino group or an alkylamino group as a substituent and having from 3 to 7 carbon atoms (including the carbon atoms of the alkylamino group) can be preferably selected. Preferred examples may include 2-aminoethyl, 2-methylaminoethyl, 2-dimethylaminoethyl, 2-aminopropyl, 2-aminobutyl, 3-aminopropyl, 2-(2'-aminoethyl)aminoethyl and 4-(3'-aminopropyl)aminobutyl.

The base represented by the formula (1) may preferably have, as a part or all of $R^2{}_n$, a side chain having a structure represented by the following formula (2). The term "a part of $R^2{}_n$" may include, for example, when n stands for 2 in the formula (1), only one $R^2$ has the structure represented by the formula (2). The term "all of $R^2{}_n$" may include both of $R^2$s having the structure of the formula (2) when n stands for 2, and $R^2$ having the structure of the formula (2) when n stands for 1.

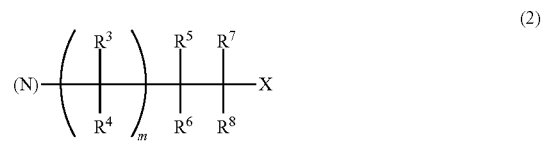

(2)

In the formula (2), $R^3$, $R^4$, $R^5$, $R^6$, $R^7$ and $R^8$ each independently represents a hydrogen atom or a $C_{1-4}$ alkyl group, X represents a hydroxyl group, an amino group or an alkylamino group, m stands for 0 or 1, and (N) is a symbol representing an attachment site to the nitrogen atom of $R^2$. $R^3$ to $R^8$ each independently represents a hydrogen atom or a $C_{1-4}$ alkyl group and a total number of carbon atoms comprised in the formula (2) is preferably 7 or less.

As the formula (2), the nitrogen atom as the basic center is coupled to the oxygen atom or nitrogen atom of the functional group represented by X in the formula (2) via two or three carbon atoms therebetween so that a strong interaction attributable to a hydrogen bond occurs between the nitrogen atom as the basic center and the functional group X, and nucleophilicity of the nitrogen atom as the basic center is controlled appropriately.

As a result, water solubility of the amide produced as a byproduct can be obtained dominantly. In addition, even when a polymer being a target of deprotection and having a phenolic hydroxyl group protected with an acyl group, has a functional group which may undergo hydrolysis under a basic condition or is susceptible to a nucleophilic reaction (for example, even when the polymer has an ester structure derived from an aliphatic alcohol), a reaction condition under which only the deprotection of an acyl group is performed without deterioration of the functional group can be selected. Deterioration of even a trace of the ester structure derived from an aliphatic alcohol may cause a great change in the physical properties of the polymer, but the risk of causing the deterioration can be reduced effectively by using the amine compound represented by the formula (2). In fact, pKa of n-butylamine is 10.6, while the first pKa of ethylene diamine having an amino group at the β-position of the side chain is 9.9 and the pKa of ethanolamine having a hydroxyl group at the β-position of the side chain is smaller (pKa=9.5) and more preferable. The risk of causing a side reaction other than deacylation can be suppressed. As described above, this effect is particularly marked when the amine compound has a hydroxyl group. As shown later in Examples, a reaction rate in the deprotection reaction of an acyl group is sufficiently great compared with triethylamine.

Preferable examples of the formula (2) in which X represents a hydroxyl group may include 2-hydroxyethyl, 2-hydroxypropyl, 2-hydroxybutyl, 3-hydroxypropyl, 2-(2'-hydroxyethoxy)ethyl, 2-(2'-hydroxyethoxy)propyl, 3-(2'-hydroxyethoxy)propyl, 1-methyl-2-hydroxypropyl, and 2,3-dihydroxypropyl. Preferable examples of the formula (2) in which X represents an amino group may include 2-aminoethyl, 2-aminopropyl, 2-aminobutyl, 3-aminopropyl, 2-(2'- aminoethyl)aminoethyl and 4-(3'-aminopropyl)aminobutyl. Preferable examples of the formula (2) in which X represents an alkylamino group may include 2-methylaminoethyl and 2-dimethylaminoethyl. However, examples are not limited to the above examples.

Preferable examples of the primary or secondary amine compound used as a deprotecting reagent may include ethanolamine, diethanolamine, methylethanolamine, ethylethanolamine, 2-propanolamine, 2-butanolamine, 3-propanolamine, 2-amino-1-butanol, 4-amino-1-butanol, 2-amino-2-methyl-1-propanol, 3-hydroxypiperidine, 2-amino-3-methyl-1-butanol, 6-amino-1-hexanol, 6-amino-2-methyl-2-heptanol, 4-hydroxypiperidine, diaminoethane, 1,2-diaminopropane, 1,3-diaminopropane, 1,2-diaminobutane, 2,3-diaminobutane and spermidine.

When the above-described amine compound is used for removal of the acyl group from the polymer comprising a unit structure having a phenolic hydroxyl group protected with an acyl group, and contains, in the side chain thereof, no primary or secondary amino group other than the nitrogen atom as the basic center, the amine compound is used preferably in an equimolar amount or greater relative to the acyl group to be deprotected in order to have a high deprotection reaction rate. When the amine compound contains a primary or secondary amino group in the side chain thereof, the reaction due to the amino group can also be expected. For example, when the compound is 1,2-diaminoethane, it is preferred to use 0.5 or more molar equivalent of 1,2-diaminoethane. A deprotection reaction is performed usually by using from 1 to 50 molar equivalents, preferably from 1.1 to 30 molar equivalents of an amine compound per the acyl group of the polymer to be deprotected. The amount of a dibasic amine such as 1,2-diaminoethane may be reduced to half, while the amount of tribasic amine may be reduced to one third. For the deprotection reaction, one or more primary or secondary amine compounds each having a ClogP value of 1.00 or less may be used singly or in combination.

The deprotection reaction of a polymer having a phenol hydroxyl group protected with an acyl group by using the base, can be carried out while referring to the conventional deprotection reaction using triethylamine with regard to the other condition (for example, JP 2002-062652A, JP 2007-254495A, JP 2003-084440A and JP 2002-244297A).

The organic solvent to be used in the deprotection reaction may be preferably a solvent capable of dissolving both the protected polymer and a deprotecting reagent therein for enabling a homogeneous deprotection reaction.

As for selecting a solvent for the reaction, the reaction in the present invention is presumed to differ in mechanism from a solvolysis reaction using triethylamine so that a protic solvent such as water and alcohol is not essential. Nevertheless, alcohol is a preferable solvent also in the acyl deprotecting reaction in the present invention. Water may be added in the method of the present invention as long as the water does not disturb the dissolution of the polymer.

Preferred examples of the solvent may include alcohol such as methanol, ethanol, propanol and butanol (each, including a structural isomer thereof), ethylene glycol, ethylene glycol monoalkyl ether, propylene glycol and propylene glycol monoalkyl ether; ether such as diethyl ether, tert-butyl methyl ether, dibutyl ether, tetrahydrofuran, 1,4-dioxane, diglyme and propylene glycol monomethyl ether acetate; a polar aprotic solvent such as N,N-dimethylformamide, N,N-dimethylacetamide, dimethylsulfoxide and N-methylpyrrolidone; ester such as ethyl acetate and butyl acetate; ketone such as acetone and 2-butanone; and nitrile such as acetonitrile. Further, adjustment of the polarity of the solvent upon after treatment may be conducted here by using a hydrocarbon such as hexane, heptane, benzene, toluene or xylene as another solvent.

Of these solvents, methanol, ethanol, isopropanol, tert-butyl methyl ether, dibutyl ether, tetrahydrofuran, 1,4-dioxane and toluene are particularly preferred. Methanol or ethanol is often used as a mixed solvent with the other solvent or solvents. The solvents other than methanol and ethanol may also be used as a mixed solvent with the other solvent or solvents.

In order to carry out the deprotection reaction completely, it is preferred to control the reaction solvent in consideration of the physical properties of the polymer to be deprotected, thereby causing no separation of the polymer before or after the reaction. Use of the above-described solvent in an amount of from 1 to 5 parts by weight based on 1 part by weight of the polymer can usually bring such a reaction.

The deprotection reaction may be performed by dissolving in the organic solvent the protected polymer comprising at least a unit structure having a phenolic hydroxyl group protected with an acyl group and a deprotecting reagent selected from primary or secondary amine compounds having a ClogP value of 1.00 or less wherein neither of the two carbon atoms coupled to the nitrogen atom of the amino group of the secondary amine compound is tertiary, and then optionally heating the resulting solution.

The deprotection reaction may be performed under an atmospheric condition, but it is preferred to perform the reaction under an inert gas atmosphere such as nitrogen atmosphere or argon atmosphere from the standpoint of safety.

When the deprotection reaction is performed at, for example, 40 to 100° C., 99% or greater of the acyl groups may be removed in 0.5 to 8 hours, mostly in from 1 to 3 hours.

The deprotected polymer may be taken out from the reaction mixture by controlling the polymer concentration of the reaction mixture to cause precipitation with water or may be taken out as a purified polymer solution by carrying out a partitioning operation between a solution phase having the polymer dissolved therein and an aqueous phase for extracting and removing the amine. Either method is commonly used and can be carried out as follows.

In the case of precipitation with water, it is the common practice to concentrate the reaction mixture under reduced pressure, remove water, if any, as much as possible by using an ordinarily used azeotropic solvent such as ethanol, and remove also a water-insoluble solvent, if any, as much as possible to obtain a solution of a water-soluble solvent having a preferable polymer concentration, as a rough standard, of 20 to 50% by weight. As the water-soluble solvent, methanol and acetone are most preferred, but the other water-soluble solvent such as THF or acetonitrile may be used. A crystallized and solidified polymer can be obtained by adding the resulting solution of the water-soluble solvent dropwise to water of preferably 10 to 100 times the weight of the water-soluble solvent used for dissolution of the polymer. In the method of the present invention, the base having high water solubility may be used so that the base dissolves in the aqueous phase easily. By this method, the polymer can be easily solidified. When a trace of the base is removed, it can be removed completely by carrying out precipitation with water of the polymer, which has solidified once, with a dilute aqueous solution of a weak acid such as acetic acid.

Also in the purification by using the partitioning method making use of a solution phase to be separated into two phases, when the reaction mixture is concentrated prior to the partitioning treatment, an amount of the base lost by the concentration is slight in comparison with that of triethylamine so that an appropriate amount of the weak acid to be added to the aqueous phase for the removal of the base can be expected rationally and easily. Accordingly, it is possible to reduce the risk of conducting treatment with an excess acid and remove the base completely by means of an extraction operation with the weak acid. The method of removing the base by using such a partitioning method can be effected, for example, by concentrating the reaction mixture to about from 0 to 10 times the weight of the solute; optionally adding a good solvent (such as ethyl acetate, acetone or methanol) to the concentrate to prepare a polymer solution having a polymer concentration of about 5 to 50% by weight; adding a weak acid such as acetic acid in water to the polymer solution wherein the weight of the water is 1 to 25 times the weight of the solute and the weak acid is in an equimolar amount (or in slightly excessive amount) to the amount of the base contained in the polymer solution; mixing the resultant thoroughly; allowing the reaction mixture to stand; and carrying out separation.

Moreover, the base used in the present invention is advantageous for a combination of a fractionation technique in accordance with a partitioning method for removing a low molecular compound and the above-described partitioning method (for example, JP 2009-24122A). According to the partitioning method for the fractionation technique, a partitioning operation is performed using an organic good-solvent phase (such as acetone, ethyl acetate, propylene glycol monoethyl ether, propylene glycol monoethyl ether acetate or THF) and an organic poor-solvent phase (such as pentane, hexane, heptane, cyclohexane or toluene). According to the partitioning method for removing an organic base, a partitioning operation is performed using an organic phase and a weakly acidic aqueous phase. Compared with triethylamine, the base used in the present invention has a higher selectivity of entering into the good solvent phase in the former and of entering into the aqueous phase in the latter. This makes it possible to properly control the amount of an acid used for the weakly acidic water phase. As a result, even when the polymer has an acid-labile group, deterioration due to an excessive acid can be prevented. When the polymer does not have an acid-labile group, a reliable removal of a base component from the polymer solution is facilitated.

The partitioning operation for removing the low molecular compound can be conducted referring to JP 2009-24122A. For example, the partitioning operation can be conducted by dissolving the polymer-containing solute in a organic good solvent wherein the weight ratio of the solute to the organic good solvent is 1: (0.5 to 5), preferably 1: (0.7 to 3); adding an organic poor solvent to the resulting solution wherein a weight of the organic poor solvent is 2 to 25 times the weight of the solute, preferably 2 to 15 times the weight of the solute; mixing the resulting mixture thoroughly; allowing the reaction mixture to stand; and carrying out separation.

The partitioning operation for removing the base component can be conducted as described above, for example, by dissolving the polymer-containing solute in the organic good solvent wherein the weight ratio of the solute to the organic good solvent is 1:(0.5 to 5); adding an weak acid in water thereto wherein the weight ratio of the solute to the water is 1:(1 to 25) and the weak acid is in an equimolar amount (or slightly excessive amount) relative to the base contained; mixing the resulting mixture thoroughly; allowing the reaction mixture; and carrying out separation.

The present invention can provide a method of producing a base polymer for chemically amplified resist comprising a step of carrying out the above deprotection method. By using the method of deprotecting the protected polymer according to the present invention, deprotection can be carried out reliably in a short period of time, and when the resulting polymer is used for a chemically amplified resist, a change in the resist performance due to the contamination which will adversely affect the catalyst action of an acid can be prevented.

EXAMPLES

The present invention will hereinafter be described specifically. It should not be construed that the present invention is limited to or by the following examples.

Example 1

A solution was prepared by placing 53.9 g of acetoxystyrene, 9.7 g of acenaphthylene, 36.3 g of a monomer (3) which will be described below, 6.8 g of dimethyl-2,2'-azobis-(2-methylpropionate) (trade name "V601"; product of Wako Pure Chemicals) and 75 g of toluene as a solvent in a 300-mL dropping cylinder under a nitrogen atmosphere. Separately, 25 g of toluene was placed in a 500-mL polymerization flask under a nitrogen atmosphere and then the solution prepared above was added dropwise to the flask over 4 hours while heating the flask at 80° C. After completion of the dropwise addition, stirring was continued for 20 hours while keeping the polymerization temperature at 80° C., followed by cooling to room temperature. The polymerization solution thus obtained was added dropwise to 1200 g of hexane and a copolymer thus precipitated was collected by filtration. The copolymer thus obtained by filtration was washed twice with 200 g of hexane and provided for a subsequent reaction.

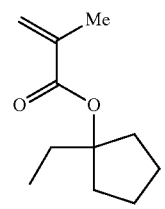

(3)

The copolymer (Polymer (X)) thus obtained was dissolved in 180 g of THF (tetrahydrofuran) and 60 g of methanol in a 500-mL flask under a nitrogen atmosphere. To the resulting solution was added 18.7 g of ethanolamine and the resulting mixture was stirred at 60° C. for 2.5 hours under a nitrogen atmosphere. The reaction mixture was concentrated under reduced pressure. A solution obtained by dissolving the concentrate in 300 g of ethyl acetate was transferred to a separating funnel and a partitioning operation was performed by adding 200 g of water and 9.4 g of acetic acid to the solution. The lower layer thus obtained was then removed and a partitioning operation was performed by adding 200 g of water and 12.5 g of pyridine to the resulting organic layer. The lower layer thus obtained was then removed and the organic layer obtained was subjected to water washing and partitioning by using 200 g of water (the water washing and partitioning were performed five times in total). (Partitioning with good separability was attained by adding 30 g of acetone with stirring for a while when the reaction mixture was allowed to stand in each partitioning step). After the organic layer obtained by partitioning was concentrated, the concentrate was dissolved in 140 g of acetone. The resulting acetone solution filtered through a 0.02-μm nylon filter was added dropwise to 1800 g of water and a precipitate thus obtained was filtered, washed with water, and dried to obtain 82.0 g of a white hydroxystyrene copolymer (Polymer 1). It is not necessary to pass the solution through a nylon or UPE filter upon synthesis of the polymer when defects of the polymer can be neglected particularly in semiconductor-related applications.

As a result of $^1$H-NMR analysis of the resulting copolymer, neither decomposition of the methacrylic ester group of the copolymer nor an impurity derived from ethanolamine was detected.

Example 2

In the same manner as in Example 1 except for use of a monomer (4) instead of the monomer (3), the polymerization reaction was conducted to obtain 78.0 g of a white polymer (Polymer 2).

As a result of $^1$H-NMR analysis of the resulting copolymer, neither decomposition of the benzoic acid ester group of the copolymer nor an impurity derived from ethanolamine was detected.

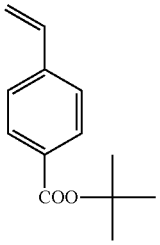

(4)

Example 3

In the same manner as in Example 1 except for use of a monomer (5) instead of the monomer (3), the polymerization reaction was conducted to obtain 75.0 g of a white polymer (Polymer 3).

As a result of $^1$H-NMR analysis of the resulting copolymer, neither decomposition of the methacrylic ester group of the copolymer nor an impurity derived from ethanolamine was detected.

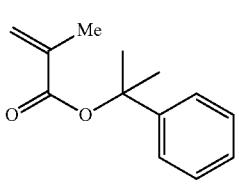

(5)

Example 4

A solution was prepared by placing 53.9 g of acetoxystyrene, 9.7 g of acenaphthylene, 36.3 g of the monomer of the above formula (3), 6.8 g of dimethyl-2,2'-azobis-(2-methylpropionate) (trade name "V601"; product of Wako Pure Chemicals) and 75 g of toluene as a solvent in a 300-mL dropping cylinder under a nitrogen atmosphere. Separately, 25 g of toluene was placed in a 500-mL polymerization flask under a nitrogen atmosphere and then the solution prepared above was added dropwise to the flask over 4 hours while heating the flask at 80° C. After completion of the dropwise addition, stirring was continued for 20 hours while keeping the polymerization temperature at 80° C., followed by cooling to room temperature. The polymerization solution thus obtained was added dropwise to 1200 g of hexane and a copolymer thus precipitated was collected by filtration. The copolymer thus obtained by filtration was washed twice with 200 g of hexane and provided for a subsequent reaction.

The copolymer thus obtained was dissolved in 180 g of THF and 60 g of methanol in a 500-mL flask under a nitrogen atmosphere. To the resulting solution was added 18.7 g of ethanolamine and the resulting mixture was stirred at 60° C. for 2 hours under a nitrogen atmosphere. The reaction mixture was concentrated and the concentrate was dissolved in 120 g of methanol and 25 g of acetone. While stirring the resulting solution, 225 g of hexane was added dropwise to the solution from a dropping funnel. Thirty minutes later, 66 g of tetrahydrofuran was added to the lower layer (polymer layer). While stirring the resulting mixture, 230 g of hexane was added dropwise. Thirty minutes later, the lower layer (polymer layer) was concentrated under reduced pressure. A solution obtained by dissolving the concentrate in 300 g of ethyl acetate was transferred to a partitioning funnel and a partitioning operation was performed by adding 200 g of water and 9.4 g of acetic acid to the solution. The lower layer thus obtained was then removed and a partitioning operation was performed by adding 200 g of water and 12.5 g of pyridine to the resulting organic layer. The lower layer thus obtained was then removed and the organic layer obtained was subjected to water washing and partitioning by using 200 g of water (the water washing and partitioning were performed five times in total). (Partitioning with good separability was attained by adding 30 g of acetone with stirring for a while when the reaction mixture was allowed to stand in each partitioning step).

After the organic layer obtained by partitioning was concentrated, the concentrate was dissolved in 120 g of acetone. The resulting acetone solution filtered through a 0.02-μm nylon filter was added dropwise to 1800 g of water and a crystallized precipitate thus obtained was filtered, washed with water, and dried to obtain 70.0 g of a white hydroxystyrene copolymer (Polymer 4).

As a result of $^1$H-NMR analysis of the resulting copolymer, neither decomposition of the methacrylate ester group of the copolymer nor an impurity derived from ethanolamine was detected.

Example 5

A solution was prepared by placing 60.5 g of acetoxystyrene, 6.8 g of indene, 32.7 g of 4-chlorostyrene, 6.5 g of dimethyl-2,2'-azobis-(2-methylpropionate) (trade name "V601"; product of Wako Pure Chemicals) and 108 g of toluene as a solvent in a 300-mL dropping cylinder under a nitrogen atmosphere. Separately, 43 g of toluene was placed in a 500-mL polymerization flask under a nitrogen atmosphere and then the solution prepared above was added dropwise to the flask over 4 hours while heating the flask at 80° C. After completion of the dropwise addition, stirring was continued for 20 hours while keeping the polymerization temperature at 80° C., followed by cooling to room temperature. The polymerization solution thus obtained was added dropwise to 1500 g of hexane and a copolymer thus precipitated was collected by filtration. The copolymer thus obtained by filtration was washed twice with 300 g of hexane and provided for a subsequent reaction.

The copolymer thus obtained was dissolved in 180 g of THF and 60 g of methanol in a 500-mL flask under a nitrogen atmosphere. To the resulting solution was added 22.3 g of ethanolamine and the resulting mixture was stirred at 60° C. for 2.5 hours under a nitrogen atmosphere. The reaction mixture was concentrated under reduced pressure. A solution obtained by dissolving the concentrate in 300 g of ethyl acetate was transferred to a separating funnel and a partitioning operation was performed by adding 200 g of water and 11.2 g of acetic acid to the solution. The lower layer thus obtained was then removed and a partitioning operation was performed by adding 200 g of water and 14.9 g of pyridine to the resulting organic layer. The lower layer thus obtained was then removed and the organic layer obtained was subjected to water washing and partitioning by using 200 g of water (the water washing and partitioning were performed five times in total). (Partitioning with good separability was attained by adding 30 g of acetone with stirring for a while when the reaction mixture was allowed to stand in each partitioning step). After the organic layer obtained by partitioning was concentrated, the concentrate was dissolved in 130 g of acetone. The resulting acetone solution filtered through a 0.02-μm nylon filter was added dropwise to 1800 g of water and a precipitate thus obtained was filtered, washed with water, and dried to obtain 55.0 g of a white hydroxystyrene copolymer (Polymer 5). It is not necessary to pass the solution through a nylon or UPE filter upon synthesis of the polymer when defects of the polymer can be neglected particularly in semiconductor-related applications.

As a result of $^1$H-NMR analysis of the resulting copolymer, no impurity derived from ethanolamine was detected.

Comparative Referential Example 1

In the same manner as in Example 1 except that deprotection was conducted according to the conventional method by using methanolysis with triethylamine/methanol (reaction for 40 hours at 60° C. under a nitrogen atmosphere) instead of using ethanolamine, the reaction was conducted to obtain 81.0 g of a white polymer (Comparative Referential Polymer 1).

Comparative Referential Example 2

In the a same manner as in Example 1 except that the polymerization reaction was carried out by using indene and 4-chlorostyrene instead of acenaphthylene and the monomer (3), respectively, and the polymer thus obtained was deprotected according to the conventional deprotection method, that is, methanolysis using triethylamine/methanol (reaction for 40 hours at 60° C. under a nitrogen atmosphere), the reaction was conducted to obtain 60.0 g of a white polymer (Comparative Referential Polymer 2).

Comparison Experiment 1

Simple Comparison Experiment Between Ethanolamine and N-Butylamine

Ethanolamine and n-butylamine as a deprotecting agent were compared by using Polymer (X) being obtained in Example 1 and still having an acetyl group. In the following formulas, Me represents a methyl group.

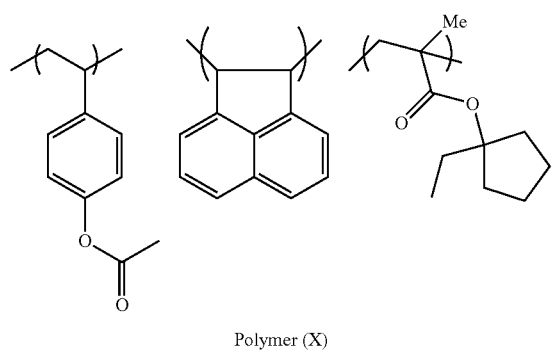

Polymer (X)

Condition 1:

Under a nitrogen atmosphere, log of Polymer (X) was dissolved in 18 g of THF and 6 g of methanol in a 100-mL flask. To the resulting solution was added 1.9 g of ethanolamine and the resulting mixture was stirred at 60° C. for 3 hours. The reaction mixture was concentrated under reduced pressure and the concentrate thus obtained was dissolved in 40 g of acetone. The acetone solution was added dropwise to 1000 g of water and a crystallized precipitate thus obtained was filtered and dried to yield 7.0 g of a white hydroxystyrene copolymer (Polymer Z1).

Condition 2:

In the same manner as in "Condition 1" except that n-butylamine was used instead of ethanolamine, the deprotection reaction was conducted to obtain 6.5 g of a white hydroxystyrene copolymer (Polymer Z2).

As a result of $^1$H-NMR analysis of Polymer Z1 and Polymer Z2, it was confirmed that the acetoxy-protected group disappeared and a phenolic hydroxyl group appeared. In addition, ester decomposition of the methacrylic acid ester group of the copolymer was not observed. However, 7.6 mol % of the amide (A) which was an impurity produced by the deprotection was observed in Polymer Z1, while 10.6 mol % of the amide (B) was observed in Polymer (B). This has revealed that compared with the amide (A), the amide (B) has high lipophilicity and brings difficulty in purification.

Comparison Test 2

Ethanolamine Vs Triethylamine

A deprotection reaction of Polymer (X) was performed by using the conventional method, that is, methanolysis using triethylamine/methanol instead of ethanolamine (reaction was conducted at 60° C. for 20 hours under a nitrogen atmosphere). As a result of $^1$H-NMR analysis of the resulting copolymer, it was confirmed that 11.2 mol % of the acetoxy-protected group remained when the reaction was conducted for 20 hours. This suggests that a reaction time for 20 hours or more is necessary for the deprotection reaction with triethylamine.

<Evaluation>
Preparation of Resist

Resist materials were prepared by dissolving the polymer compounds (Polymers 1 and 5, and Comparative Referential Polymers 1 and 2) obtained above, an acid generator (PAG-1) represented by the formula below, a basic compound (Base-1) and a crosslinking agent in an organic solvent in accordance with the compositions as shown in Table 1, respectively. Each of the compositions thus obtained was filtered through 0.02-μm nylon and UPE filters to prepare a solution of the positive or negative resist material.

<Acid Generator>

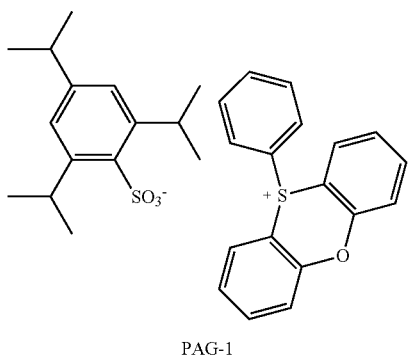

PAG-1

<Basic Compound>
Base-i: tris(2-(methoxymethoxy)ethyl)amine N-oxide
<Crosslinking Agent>
Tetramethoxymethyl glycoluril (TMGU)<
<Surfactant>
Upon preparation of a resist material by using each composition, 0.075 weight parts of "PF-636" (trade name; product of Omnova) was added as a surfactant.
<Organic Solvent>
The organic solvents shown in Table 1 are PGMEA (propylene glycol monomethyl ether acetate), EL (ethyl lactate), and PGME (propylene glycol monomethyl ether).

TABLE 1

| | Resin (weight part: wtp) | acid generator (wtp) | base (wtp) | additive (wtp) | solvent1 (wtp) | solvent2 (wtp) | solvent3 (wtp) |
|---|---|---|---|---|---|---|---|
| Example 1 | Polymer 1 (80) | PAG-1 (8) | Base-1 (0.46) | — | PGMEA (800) | EL (800) | PGME (1000) |
| Comp. Ref. Example 1 | Comp. Ref. Polymer 1 (80) | PAG-1 (8) | Base-1 (0.46) | — | PGMEA (800) | EL (800) | PGME (1000) |
| Example 5 | Polymer 5 (80) | PAG-1 (8) | Base-1 (0.46) | TMGU (8.2) | PGMEA (800) | EL (800) | PGME (1000) |
| Comp. Ref. Example 2 | Comp. Ref. Polymer 2 (80) | PAG-1 (8) | Base-1 (0.46) | TMGU (8.2) | PGMEA (800) | EL (800) | PGME (1000) |

Evaluation of Electron Beam Lithography

Each of the positive resist materials thus prepared (in Examples 1 and 5 and Comparative Referential Examples 1 and 2) was spin-coated on a 152-mm square mask blank having a chromium oxynitride film on the uppermost surface by using "ACT-M" (trade name; product of Tokyo Electron Limited), followed by prebaking on a hot plate at 110° C. for 600 seconds to prepare a resist film of 90 nm thick. The thickness of the resist film thus obtained was measured using an optical measurement system "Nanospec" (trade name; product of Nanometrics Incorporated). Measurement was conducted at 81 positions within the surface of the blank substrate except the peripheral portion from the periphery of the blank substrate to 10 mm inside thereof, and an average film thickness and a thickness range were determined.

Further, the blank substrate was exposed using an electron beam exposure device (trade name "EBM-5000 plus"; product of NuFlare Technology, Inc., acceleration voltage: 50 keV), baked at 110° C. for 600 seconds as the post-exposure bake (PEB), and developed with a 2.38% by weight aqueous solution of tetramethylammonium hydroxide, whereby a positive-type or negative-type pattern was obtained. The resist pattern thus obtained was evaluated in the following manner.

The substrate having the pattern formed thereon was observed with a top view SEM (scanning electron microscope). An exposure dose at which a 200 nm 1:1 line and space pattern was resolved at 1:1 was designated as the optimum exposure dose ($\mu C/cm^2$); a minimum dimension at the exposure dose at which a 200 nm line and space pattern was resolved at 1:1 was designated as limiting resolution; and a line edge roughness (LER) at 100 nm line and space was measured using SEM. Regarding the pattern shape, whether it was rectangular or not was judged visually. Evaluation results of the resist material of the present invention and the resist material for comparison in the EB lithography are shown in Table 2.

TABLE 2

| | Optimum exposure dose ($\mu C/cm^2$) | limiting resolution (nm) | line edge roughness (nm) | shape of pattern |
|---|---|---|---|---|
| Example 1 | 12.1 | 50 | 4.7 | rectangular |
| Comp. Ref. Ex. 1 | 12.5 | 50 | 4.8 | rectangular |
| Example 5 | 15.3 | 50 | 4.4 | rectangular |
| Comp. Ref. Ex. 2 | 15.4 | 50 | 4.5 | rectangular |

As shown above in Table 2, the hydroxystyrene derivative obtained by deprotection with the base according to the present invention is equivalent in sensitivity, resolution, line edge roughness and pattern shape to the resin obtained by the conventional formulation. It is evident that the production method according to the present invention can provide resins equivalent to the conventional one at a high efficiency and is very useful.

The invention claimed is:

1. A method of deprotecting a protected polymer, comprising at least a step of dissolving in an organic solvent the protected polymer comprising at least a unit structure having a phenolic hydroxyl group protected with an acyl group and a deprotecting reagent selected from the group consisting of primary and secondary amine compounds each having a ClogP value of 1.00 or less with the proviso that in the secondary amine compound, neither of the two carbon atoms coupled to the nitrogen atom of the amino group is tertiary, to deprotect the protected polymer;

wherein said primary amine and secondary amine compounds are represented by the formula (1):

wherein $R^1$ represents a hydrogen atom or a linear, branched or cyclic $C_{1-6}$ alkyl group, $R^2$ independently represents a linear, branched or cyclic $C_{2-7}$ alkyl group comprising at least one oxygen atom or at least one nitrogen atom, two $R^2$s may be coupled to each other to form a cyclic structure comprising at least one oxygen atom and/or at least one nitrogen atom, and n stands for 1 or 2.

2. The method of deprotecting a protected polymer according to claim 1, wherein a part or all of $R^2_n$ in the formula (1) has a structure represented by the following formula (2):

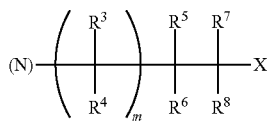

(2)

wherein $R^3$, $R^4$, $R^5$, $R^6$, $R^7$ and $R^8$ each independently represents a hydrogen atom or a $C_{1-4}$ alkyl group, X represents a hydroxyl group, an amino group or an alkylamino group, m stands for 0 or 1, and (N) is a symbol representing an attachment site to the nitrogen of $R^2$.

3. The method of deprotecting a protected polymer according to claim 1, wherein said protected polymer further comprises a unit structure having an ester structure derived from an aliphatic alcohol.

4. A method of producing a base polymer for chemically amplified resist, comprising a step of:
carrying out the method of deprotecting as claimed in claim 1.

5. The method of deprotecting a protected polymer according to claim 2, wherein said protected polymer further comprises a unit structure having an ester structure derived from an aliphatic alcohol.

6. A method of producing a base polymer for chemically amplified resist, comprising a step of:
carrying out the method of deprotecting as claimed in claim 2.

7. A method of producing a base polymer for chemically amplified resist, comprising a step of:
carrying out the method of deprotecting as claimed in claim 3.

* * * * *